(12) United States Patent
Hou et al.

(10) Patent No.: US 12,293,917 B2
(45) Date of Patent: May 6, 2025

(54) SYSTEM AND METHOD FOR REMOVING IMPURITIES DURING CHEMICAL MECHANICAL PLANARIZATION

(71) Applicant: Taiwan Semiconductor Manufacturing Co., Ltd., Hsinchu (TW)

(72) Inventors: Te-Chien Hou, Hsinchu (TW); Po-Chin Nien, Hsinchu (TW); Chih Hung Chen, Hsinchu (TW); Ying-Tsung Chen, Hsinchu (TW); Kei-Wei Chen, Hsinchu (TW)

(73) Assignee: Taiwan Semiconductor Manufacturing Co., Ltd., Hsinchu (TW)

( * ) Notice: Subject to any disclaimer, the term of this patent is extended or adjusted under 35 U.S.C. 154(b) by 362 days.

(21) Appl. No.: 17/355,981

(22) Filed: Jun. 23, 2021

(65) Prior Publication Data
US 2022/0415665 A1 Dec. 29, 2022

(51) Int. Cl.
*H01L 21/321* (2006.01)
*B24B 37/34* (2012.01)
*B24B 53/017* (2012.01)
*H01L 21/306* (2006.01)

(52) U.S. Cl.
CPC ........ *H01L 21/30625* (2013.01); *B24B 37/34* (2013.01); *B24B 53/017* (2013.01)

(58) Field of Classification Search
CPC ...................... H01L 21/3212; H01L 21/32125
See application file for complete search history.

(56) References Cited

U.S. PATENT DOCUMENTS

| | | | |
|---|---|---|---|
| 5,078,801 A * | 1/1992 | Malik | H01L 21/67057 15/97.1 |
| 5,575,706 A * | 11/1996 | Tsai | B24B 57/02 451/36 |
| 6,372,111 B1 | 4/2002 | Watts | |
| 8,336,148 B2 | 12/2012 | Zhang | |
| 10,967,478 B2 * | 4/2021 | Suen | B24B 37/044 |
| 2005/0186891 A1 | 8/2005 | Benner | |
| 2006/0237031 A1 * | 10/2006 | Yi | H01L 21/02052 134/198 |
| 2015/0183081 A1 * | 7/2015 | Deng | H01L 21/30625 438/693 |
| 2016/0211155 A1 | 7/2016 | Zhang | |

(Continued)

FOREIGN PATENT DOCUMENTS

| | | |
|---|---|---|
| CN | 102528652 A | 7/2012 |
| CN | 104742007 A | 7/2015 |
| CN | 109590895 A | 4/2019 |

(Continued)

*Primary Examiner* — Thomas T Pham
(74) *Attorney, Agent, or Firm* — Seed IP Law Group

(57) ABSTRACT

A chemical mechanical planarization system includes a chemical mechanical planarization pad that rotates during a chemical mechanical planarization process. A chemical mechanical planarization head places a semiconductor wafer in contact with the chemical mechanical planarization pad during the process. A slurry supply system supplies a slurry onto the pad during the process. A pad conditioner conditions the pad during the process. An impurity removal system removes debris and impurities from the slurry.

21 Claims, 12 Drawing Sheets

(56)　　　　　References Cited

U.S. PATENT DOCUMENTS

2019/0099854 A1*　4/2019　Suen ........................ B24B 37/20
2021/0220962 A1*　7/2021　Suen ........................ B24B 37/20

FOREIGN PATENT DOCUMENTS

| | | |
|---|---|---|
| CN | 111113269 A | 5/2020 |
| CN | 111113270 A | 5/2020 |
| CN | 112242317 A | 1/2021 |
| CN | 112405335 A | 2/2021 |
| EP | 1500128 B1 | 6/2007 |
| JP | H1034535 A | 2/1998 |
| JP | H10109263 A | 4/1998 |
| JP | H10277922 A | 10/1998 |
| JP | 2004179414 A | 6/2004 |
| KR | 20030058578 A | 7/2003 |
| KR | 100614659 B1 | 8/2006 |
| TW | 436333 B | 5/2001 |
| TW | 200849364 A | 12/2008 |

\* cited by examiner

SYSTEM AND METHOD FOR REMOVING IMPURITIES DURING CHEMICAL MECHANICAL PLANARIZATION

BACKGROUND

Technical Field

The present disclosure relates to the field of chemical mechanical planarization.

Description of the Related Art

There has been a continuous demand for increasing computing power in electronic devices including smart phones, tablets, desktop computers, laptop computers and many other kinds of electronic devices. Integrated circuits provide the computing power for these electronic devices. One way to increase computing power in integrated circuits is to increase the number of transistors and other integrated circuit features that can be included for a given area of semiconductor substrate. Accordingly, many semiconductor processes and techniques have been developed to decrease the size of features in integrated circuits.

Chemical mechanical planarization is a process that has enabled the use of thin film materials that enable features of relatively small size. Chemical mechanical planarization can planarize the surface of a semiconductor wafer after thin film deposition and patterning processes. Chemical mechanical planarization utilizes chemical and mechanical processes to planarize the semiconductor wafer. While highly beneficial, chemical mechanical planarization can also be susceptible to equipment failure resulting in damaged semiconductor wafers.

DETAILED DESCRIPTION

Figure 1A:
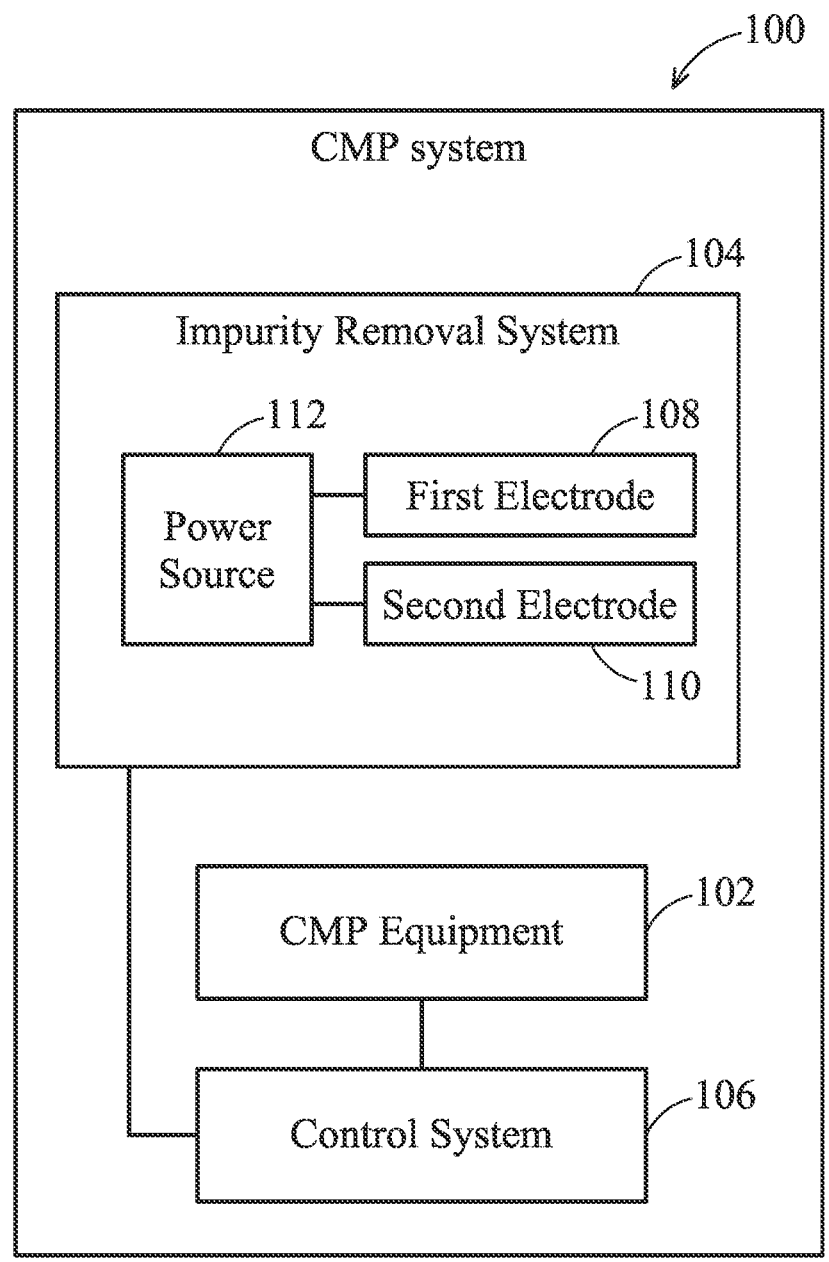
FIG. 1A is a block diagram of a chemical mechanical planarization system, according to one embodiment.

In the following description, many thicknesses and materials are described for various layers and structures within an integrated circuit die. Specific dimensions and materials are given by way of example for various embodiments. Those of skill in the art will recognize, in light of the present disclosure, that other dimensions and materials can be used in many cases without departing from the scope of the present disclosure.

The following disclosure provides many different embodiments, or examples, for implementing different features of the described subject matter. Specific examples of components and arrangements are described below to simplify the present description. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

In the following description, certain specific details are set forth in order to provide a thorough understanding of various embodiments of the disclosure. However, one skilled in the art will understand that the disclosure may be practiced without these specific details. In other instances, well-known structures associated with electronic components and fabrication techniques have not been described in detail to avoid unnecessarily obscuring the descriptions of the embodiments of the present disclosure.

Unless the context requires otherwise, throughout the specification and claims that follow, the word "comprise" and variations thereof, such as "comprises" and "comprising," are to be construed in an open, inclusive sense, that is, as "including, but not limited to."

The use of ordinals such as first, second and third does not necessarily imply a ranked sense of order, but rather may only distinguish between multiple instances of an act or structure.

Reference throughout this specification to "one embodiment" or "an embodiment" means that a particular feature, structure or characteristic described in connection with the embodiment is included in at least one embodiment. Thus, the appearances of the phrases "in one embodiment" or "in an embodiment" in various places throughout this specification are not necessarily all referring to the same embodiment. Furthermore, the particular features, structures, or characteristics may be combined in any suitable manner in one or more embodiments.

As used in this specification and the appended claims, the singular forms "a," "an," and "the" include plural referents unless the content clearly dictates otherwise. It should also be noted that the term "or" is generally employed in its sense including "and/or" unless the content clearly dictates otherwise.

Embodiments of the present disclosure provide many benefits over traditional chemical mechanical planarization systems. Embodiments of the present disclosure utilize an impurity removal system to prevent damage to semiconductor wafers and chemical mechanical planarization equipment. Accordingly, embodiments of the present disclosure increase semiconductor wafer yields and reduce the need for technicians or experts to repair or replace damaged equipment. Instead, the impurity removal system prevention module prevents dangerous debris from damaging the wafer and the chemical mechanical planarization pad. The result is that time and resources are not wasted replacing equipment and scrapped semiconductor wafers.

FIG. 1A is a block diagram of the chemical mechanical planarization (CMP) system 100, according to one embodiment. The CMP system 100 includes CMP equipment 102. The CMP equipment 102 performs CMP processes on a wafer. The CMP equipment 102 also performs various cleaning and drying operations after the CMP process.

The CMP system 100 includes an impurity removal system 108. The impurity removal system 104 performs a charged particle separation process during the CMP process. Debris, abrasive particles, and impurities may be present during the CMP process and the various cleaning processes associated with the CMP process. Often the debris, abrasive particles, and impurities include ions and charged particles. Typically, the charged particles are electrons. Some of the ions may carry a net negative charge. Some of the ions may carry a net positive charge. The charged particle separation process draws out and removes the charged particles and ions, thereby eliminating much of the debris, abrasive particles, and impurities that may be present during the CMP process and the various cleaning processes associated with the CMP process.

In one embodiment, the impurity removal system 104 includes a first electrode 108, a second electrode 110, and a power source 112. The power source 112 can be a voltage source that applies a voltage between the first electrode 108 and the second electrode 110. The first and second electrodes 108 and 110 are placed in a fluid associated with the CMP process or cleaning process. The voltage applied between the electrodes 108 and 110 results in one of the electrodes attracting and capturing positively charged ions and the other of the electrodes drawing and capturing negatively charged ions and electrons. Accordingly, debris, abrasive particles, and impurities that carry a net charge are removed from the fluid by the electrodes 108 and 110. Further details regarding the impurity removal system 104 are provided in relation to subsequent figures.

The CMP system 100 includes a control system 106. The control system 106 can control the impurity removal system 104 and the CMP equipment 102. The control system 106 can activate and deactivate the CMP equipment 102 and can activate and deactivate the impurity removal system 104.

Figure 1B:
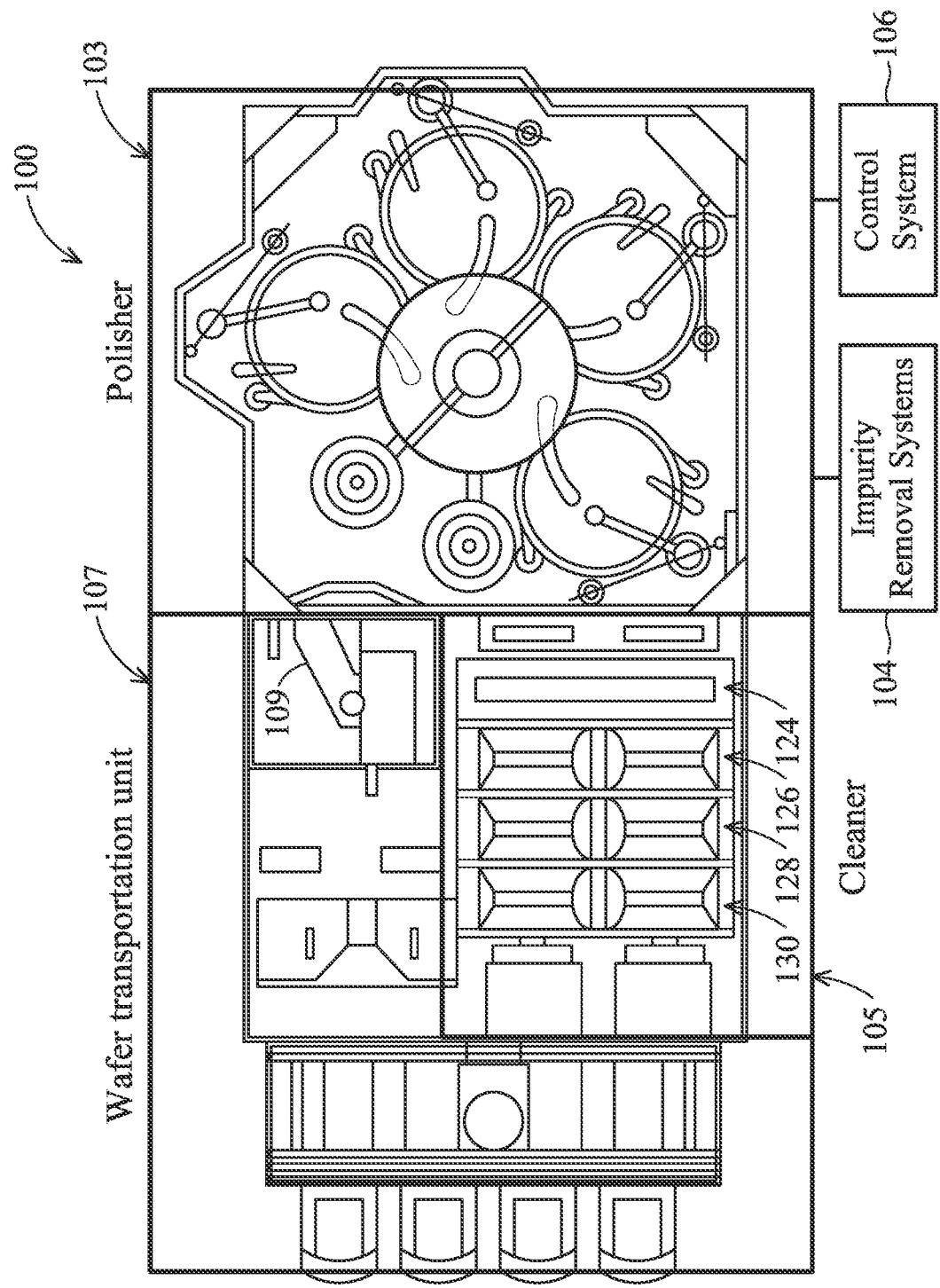
FIG. 1B is an illustration of a chemical mechanical planarization system, according to one embodiment.

FIG. 1B is an illustration of a CMP system 100, according to one embodiment. The CMP system 100 includes a polisher 103. The polisher 103 includes two main polishing stations 120 and two chemical buff stations 122. The main polishing stations 120 and the two chemical buff stations 122 perform the CMP processes on the wafers.

The polisher 103 includes two CMP heads 142. Each of the CMP heads 142 holds a wafer (not shown) face down such that the top surface of the wafer can be polished at the main polishing stations 120 and the chemical buff stations 122. When wafers are loaded into both CMP heads 142, the CMP heads 142 are moved to the main polishing stations and lowered until the top surfaces of the wafers, facing downward in this case, are in contact with a top surface of a polishing pad. The main polishing CMP process is performed at the main polishing station 120, as will be described in further detail with regards to FIGS. 2A and 2B. After the main polishing process has been performed at the main polishing stations 120, the CMP heads 142 are moved to the chemical buff stations 122 and lowered until the top surfaces of the wafers are in contact with top surfaces of respective polishing pads of the chemical buff stations 122. The chemical buff CMP process is performed at the chemical buff stations 122, as will be described in further detail with regards to FIGS. 2A and 2B. One or more impurity removal systems 104 are positioned at each of the chemical buff stations 122 and main polishing stations 120, as will be described in further detail with regards to FIGS. 2A-2C.

After the main polishing and chemical buff processes have been performed at the polisher 103, the CMP heads 142 return to the position shown in FIG. 1B. A robot arm 109 of the wafer transportation unit 107 takes the wafers from the CMP heads 142 and transports them to the cleaner 105. The wafer transportation unit 107 may include a plurality of robot arms and conveyance devices to carry the wafers between various cleaning stations of the cleaner 105.

The cleaner 105 includes a washing tank 124. The transportation unit 107 lowers the wafers edgewise into the washing tank 124. The washing tank 124 is filled with deionized water. The wafers are washed in the deionized water and removed from the washing tank 124. One or more impurity removal systems 104 are positioned in the washing tank 124 to help remove impurities from the washing tank 124. Further details regarding the washing tank 124 and the impurity removal systems are provided in relation to FIG. 3.

The cleaner 105 includes a precleaning station 126. The transportation unit 107 lowers the wafers edgewise into the precleaning station 126. At the precleaning station 126 a chemical spray bar sprays chemicals onto the wafers while a roller rotates the wafers. One or more impurity removal systems 104 are provided at the precleaning station 126 to assist in removing impurities. Further details regarding the precleaning station 126 are provided in relation to FIG. 4.

The cleaner 105 includes a brush box 128. The transportation unit 107 lowers the wafers edgewise into the brush box 128. The brush box includes rotating brushes that clean the surface of the wafers. The brush box 128 also includes chemical spray bars that spray chemicals onto the wafers while the brushes clean the wafers. One or more impurity removal systems 104 are provided at the brush box 128 to assist in removing impurities. Further details regarding the brush box 128 are provided in relation to FIG. 5.

The cleaner 105 includes a vapor dryer 130. The transportation unit 107 lowers the wafers into the vapor dryer. The vapor dryer uses vapor action to push water and then the remaining chemicals from the surface of the wafers. The vapor dryer 130 includes one or more impurity removal systems 104 to assist in removing impurities. Further details regarding the vapor dryer 130 are provided in relation to FIG. 6.

The main polishing stations 120, the chemical buff stations 122, the transportation unit 107, the washing tank 124, the precleaning station 126, the brush box 128, and the vapor dryer 130 are all examples of CMP equipment 102 as described in relation to FIG. 1A. The impurity removal systems 104 can be implemented with each of the CMP processing and cleaning equipment described in relation to FIG. 1B. The control system 106 can control the operation of the CMP equipment 102 and the impurity removal systems 104.

Figure 2A:
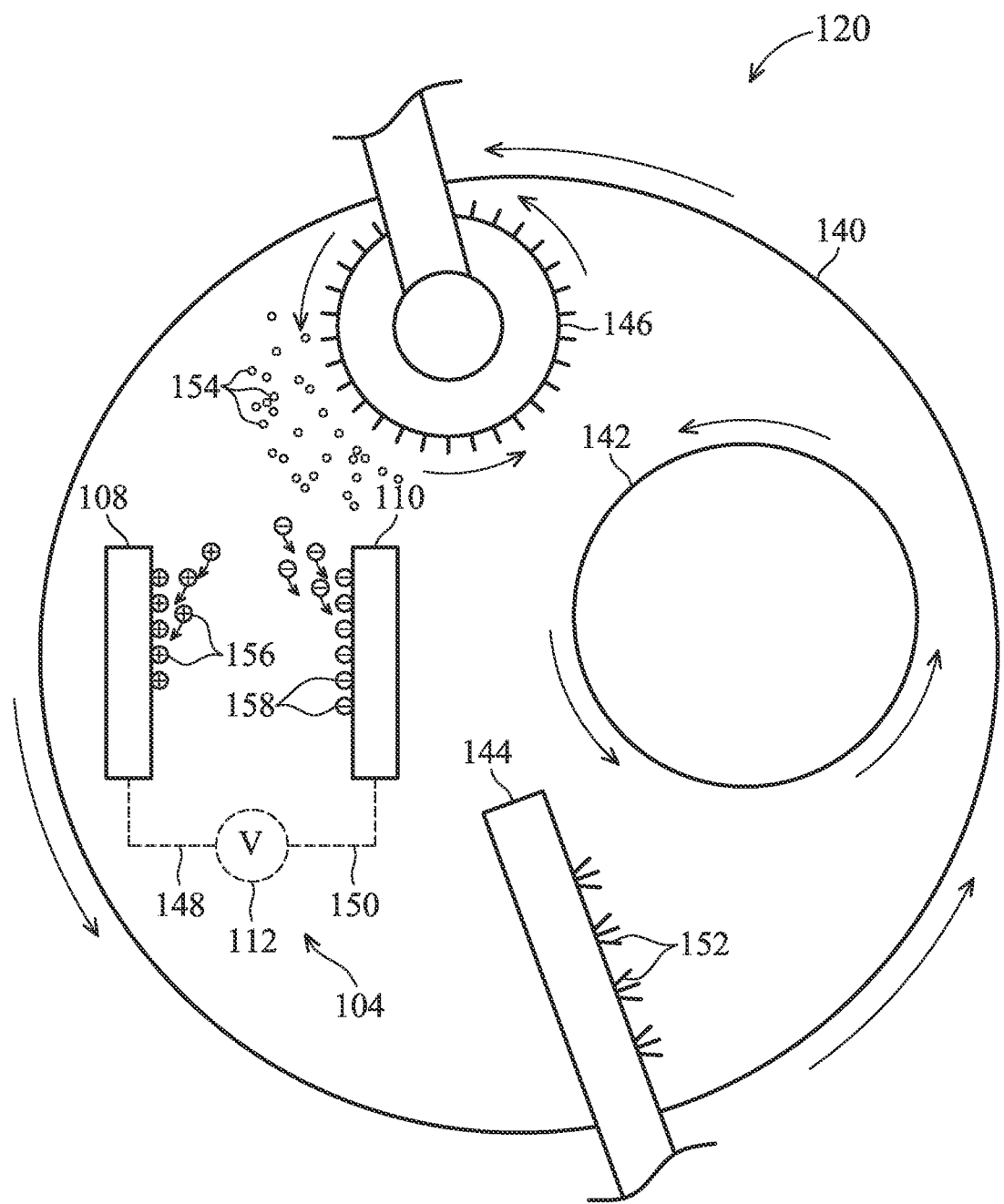
FIGS. 2A and 2B are illustrations of a main polishing station of a chemical mechanical planarization system, according to one embodiment.

FIG. 2A is a top view of a main polishing station 120 of a CMP system, according to one embodiment. The main polishing station 120 of FIG. 2A is one example of a main polishing station 120 described in relation to FIG. 1B. The CMP system 100 includes a CMP pad 140, a CMP head 142, a slurry supply system 144, a pad conditioner 146, and the impurity removal system 104. The components of the main polishing station 120 cooperate to provide an efficient CMP process that reduces the potential for damage to CMP equipment or semiconductor wafers. In particular, as will be set forth in more detail below, the impurity removal system 104 helps to prevent damage to CMP equipment and semiconductor wafers.

In one embodiment, the CMP pad 140 is placed on a platen. Because the platen is below the CMP pad 140, platen is not visible in the top view of FIG. 2A. Typically, the platen is a flat, circular, and rigid surface. The platen is configured to rotate during CMP processes. The platen may rotate with a rotational velocity of between 20 RPM and 40 RPM, though other rotational velocities can be utilized without departing from the scope of the present disclosure. In the example of FIG. 2A, the platen and the pad 140 rotate in a counterclockwise direction. The platen can be coupled to a shaft that drives the rotation of the platen. The platen may have a diameter of about 50 cm to 75 cm, though platens of other sizes can be utilized without departing from the scope of the present disclosure.

The CMP pad 140 is positioned on top of the platen. The CMP pad 140 may be circular and may have a diameter that is substantially identical to the diameter of the platen. The CMP pad 140 may be coupled to the platen by fasteners, by suction (i.e., pressure differential), by electrostatic force, or in any suitable way. When the platen rotates, the CMP pad 140 also rotates. The rotation of the CMP pad 140 is one of the factors that planarizes the semiconductor wafer, as will be described in more detail below.

The CMP pad 140 can be made of a porous material. In one example, the CMP pad 140 is made from a polymeric material having a pore size between 20 micrometers and 50 micrometers. The CMP pad 140 may have a roughness of about 50 μm. Other materials, dimensions, and structures of a CMP pad 140 can be utilized without departing from the scope of the present disclosure. The CMP pad 140 may be substantially rigid.

The slurry supply system 144 supplies a slurry 152 onto the rotating pad 140 during the CMP process. In particular, the slurry supply system 144 may have a plurality of nozzles or apertures that each output the slurry 152 onto the pad 140. The slurry 152 can include a solution of water and one or more corrosive compounds. The corrosive compounds are selected to chemically etch or remove one or more materials on the surface of the semiconductor wafer. Accordingly, the compounds in the slurry 152 are selected based on the material or materials of the surface features of the semiconductor wafer to be planarized. The slurry supply system 144 can include a tank that holds the slurry and a tube or hose that delivers the slurry onto the rotating CMP pad 140 during the CMP process.

The pad conditioner 146 conditions the rotating CMP pad 140 during the CMP process. During the CMP process, the top surface of the rotating CMP pad 140 experiences wear from the planarization process. The top surface of the rotating pad 140 may wear out unevenly such that depressions, valleys, and peaks may form in the CMP pad 140. The pad conditioner 146 includes a rotating pad conditioner head that is pressed downward onto the rotating CMP pad 140. The rotating pad conditioner head includes or is coated with a hard, durable material that can effectively sand down the surface of the CMP pad 140. In one example, the surface of the pad conditioner 146 includes a diamond material. The rotating head of the pad conditioner 146 sweeps across the surface of the rotating CMP pad 140 in a pattern selected to maintain a substantially even top surface of the CMP pad 140 during the CMP process. Accordingly, the pad conditioner 146 removes or prevents the formation of depressions, ridges, valleys, or uneven features on the surface of the rotating CMP pad 140.

During the CMP process, the CMP head 142 places the downward facing surface of the semiconductor wafer into contact with the rotating CMP pad 140. The CMP head 142 may also rotate the semiconductor wafer during the CMP process. Surface features of the downward facing surface of the semiconductor wafer are planarized during the CMP process. The planarization is achieved by both mechanical and chemical processes. The mechanical aspect of the planarization is achieved by the physical effect of the CMP pad 140 rubbing down the bottom facing surface of the semiconductor wafer. The mechanical aspect of the planarization is akin to a very fine sanding process. The chemical aspect of the planarization is achieved by the chemical effect of the slurry on the materials of the surface features of the semiconductor wafer. The compounds in the solution of the slurry etch or otherwise react with and remove the materials of the surface features of the semiconductor wafer. The result of the CMP process is that the exposed bottom facing surface of the semiconductor wafer becomes substantially planar.

In the example FIG. 2A, the slurry supply system 144 is positioned upstream from the CMP head 142. As fresh slurry 152 is supplied from the slurry supply system 144 onto the pad 140, the rotation of the pad 140 carries the fresh slurry 152 into contact with the wafer 140 held by the CMP head 142. The interaction of the slurry 152 with the wafer 140 results in debris and impurities in the slurry 152. The slurry 152 is no longer fresh after encountering the wafer held by the CMP head 142.

In the example of FIG. 2A, the pad conditioner 146 is positioned downstream from the CMP head 142. Accordingly, the rotation of the pad 140 carries the slurry from the CMP head 142 to the pad conditioner 146. The action of the pad conditioner can generate particles and debris 154 that mix with the used slurry 152. Rotation of the pad 140 carries some of the used slurry 152 back into contact with the wafer held by the CMP head 142. Accordingly, some of the impurities and debris and the slurry may come into contact with the wafer held by the CMP head 142. Though not shown in FIG. 2A, the entire surface of the pad 140 is covered in slurry 152 during the CMP process. The slurry 152 generally follows a spiral pattern and is forced to the edge of the pad 140 due to the rotational motion of the pad 140. The slurry supply system 144 constantly supplies new slurry 152 during the CMP process. Some of the slurry 152 may encounter the wafer multiple times before flowing off the edge of the pad 140 due to the rotational motion.

The contact of the various impurities and debris in the used slurry 152 may cause damage to the wafer. For example, scratches can occur in the wafer. The scratches can be attributed to abrasive particles, polishing pad debris, and brush flakes carried by the slurry 152 into contact with the wafer. Corrosion can happen when two different metals are contacted in various pH solutions, such as the water, chemicals, and impurities in the slurry. If the semiconductor wafer is damaged by the debris, impurities, or chemical action, then the semiconductor wafer may need to be scrapped. Additionally, the CMP pad 140 may also be damaged when the pad conditioner debris comes between the surfaces of the CMP pad 140 and the semiconductor wafer. This can result in a CMP pad 140 that needs to be scrapped or repaired. Either of these occurrences leads to high costs in terms of time, resources, and money in order to fix the damage or scrap the semiconductor wafer or the CMP pad 140. Furthermore, CMP processes may be interrupted for a period of time while repairs are made.

The CMP system 100 utilizes the impurity removal system 104 to prevent damage to the semiconductor wafer and the CMP pad 140 from the debris and impurities carried in the slurry. The impurity removal system 104 removes impurities and debris from the slurry 152 during the CMP process.

The impurity removal system 140 includes a first electrode 108, a second electrode 110, and the power source 112. The power source 112 can correspond to a voltage source or a current source. In one example, the power source 112 applies a voltage between the first electrode 108 and the second electrode 110. A positive voltage may be applied to the first electrode 108 and a negative voltage may be applied to the second electrode 110. The impurity removal system 140 performs a charged particle separation process on the slurry 152 as the slurry passes between or near the first electrode 108 and the second electrode 110.

The debris and impurities in the slurry 152 include positively charged particles 156 and negatively charged particles 158. The positively charged particles 156 can include positive ions. The positively charged particles 156 can include compounds or material that carries a net positive charge. The negatively charged particles 158 can include negative ions. The negatively charged particles 158 can include compounds or materials that carry a net negative charge. The negatively charged particles can also include free electrons. Accordingly, as used herein, the term "charged particles" is not exclusive to electrons, protons, or subatomic particles that may carry a net charge, but can also include ions, molecules, compounds, or material that carries a net charge.

In one embodiment, the impurity removal system 120 removes charged particles from the slurry 152 by adsorption. During the adsorption process, the slurry is deionized as the positively charged particles 156 and negatively charged particles 158 are adsorbed onto the first and second electrodes 108, 110. This process is known as charged particle separation. After a CMP process, the first and second electrodes 108, 110 may be operated in a desorption phase. During the desorption phase, the first electrode 108 and the second electrode 110 may be removed from the surface of the pad 140 and placed in a fluid, such as deionized water. The polarities of the first and second electrodes 108, 110 may be reversed such that the first electrode 108 receives a positive voltage and a second electrode 110 receives a negative voltage. The result is that the charged particles 156 and 158 are desorbed from the first electrode 108 and the second electrode 110 into the fluid. The first and second electrodes 108, 110 are now free from charged particles. The first and second electrodes 108, 110 can then be placed on the pad 140 to perform charged particle separation for another CMP process.

In one embodiment, the first and second electrodes 108, 110 can be utilized for charged particle separation or adsorption of charged particles during multiple CMP processes before a desorption processes performed. The first and second electrodes 108, 110 can be utilized for adsorption in up to 20 CMP processes before desorption process is performed. Other numbers of adsorption processes can be performed before a desorption process is performed without departing from the scope of the present disclosure.

Because the impurity removal system 104 removes a large portion of debris and impurities from the slurry 152, it is far less likely that the wafer will be damaged by debris and impurities in the slurry 152. Accordingly, the impurity removal system 104 prevents scratches and corrosion to the wafer. The result is that wafer yields are increased and the lifetime of CMP equipment is increased.

In one embodiment, the control system 106 controls the various components of the CMP system 100. The control system 106 can include one or more computer memories storing software instructions for controlling the CMP system 100. The control system 106 can include one or more processors configured to execute the software instructions. The control system 106 can be electronically connected via a wired or wireless connections to the various components of the CMP system 100. The control system 106 can activate, deactivate, and adjust the operation of the various components of the CMP system 100. The control system 106 may be dispersed among one or more of the components of the CMP system 100.

In one embodiment, the control system 106 activates the impurity removal system 104 as soon as a CMP process begins. In this case, the impurity removal system 104 is active throughout the CMP process regardless of the age or accumulated usage of the various components of the CMP system 100. The control system 106 deactivates the impurity removal system 104 when the CMP process ends.

In one embodiment, the control system 106 selectively activates the impurity removal system 104 based on various criteria. For example, the control system 106 may activate the impurity removal system based on the age or accumulated usage of the pad conditioner 146. Before the pad conditioner has been used much, particles from the pad conditioner 146 are less likely to break off. Accordingly, in some cases it may be desirable to refrain from activating the impurity removal system 104 while the pad conditioner is new or only lightly used. After the pad conditioner 146 has aged or has been used more, the control system 106 may activate the impurity removal system 104 due to the increased likelihood that particles, such as diamond particles, may become dislodged from the pad conditioner. The control system 106 may also selectively activate the impurity removal system 104 based on the age or accumulated usage of the CMP pad 140. Selectively activating the impurity removal system 104 can extend the lifetime of the impurity removal system 104. In particular, selectively activating the impurity removal system 104 may extend the lifetime of the filter 114. Additionally, the control system 106 may activate the impurity removal system 104 intermittently during a CMP process. For example, the control system 106 may activate the impurity removal system 104 for every other rotation of the CMP pad 140, for every third rotation of the CMP pad 140, or for other selected intermittent patterns.

In one embodiment, the Main polishing station 120 performs a CMP process after deposition of a metal for a gate electrode of a transistor. For example, tungsten may be deposited in a trench formed for a gate electrode of a transistor. After deposition of the gate electrode tungsten, the wafer may be transferred to the Main polishing station 120. The Main polishing station 120 may then perform a CMP process remove excess tungsten and planarize the surface of the gate electrode. The Main polishing station 120 may be used to perform planarization operations after a large variety of semiconductor processes. Such semiconductor processes can include metal deposition for metal plugs, metal deposition for metal lines, silicon oxide deposition for trench isolation or for other purposes, and other semiconductor processes.

The orientation of the first electrode 108 and the second electrode 110 in FIG. 2A is known as a flow by configuration. In the flow by configuration, the slurry 152 primarily flows between the first electrode 108 and the second electrode 110 in a direction more or less parallel to the first and second electrodes 108, 110. However, as will be described in further detail in relation to FIG. 2B, other orientations of the first and second electrodes 108, 110 can be utilized without departing from the scope of the present disclosure.

Figure 2B:
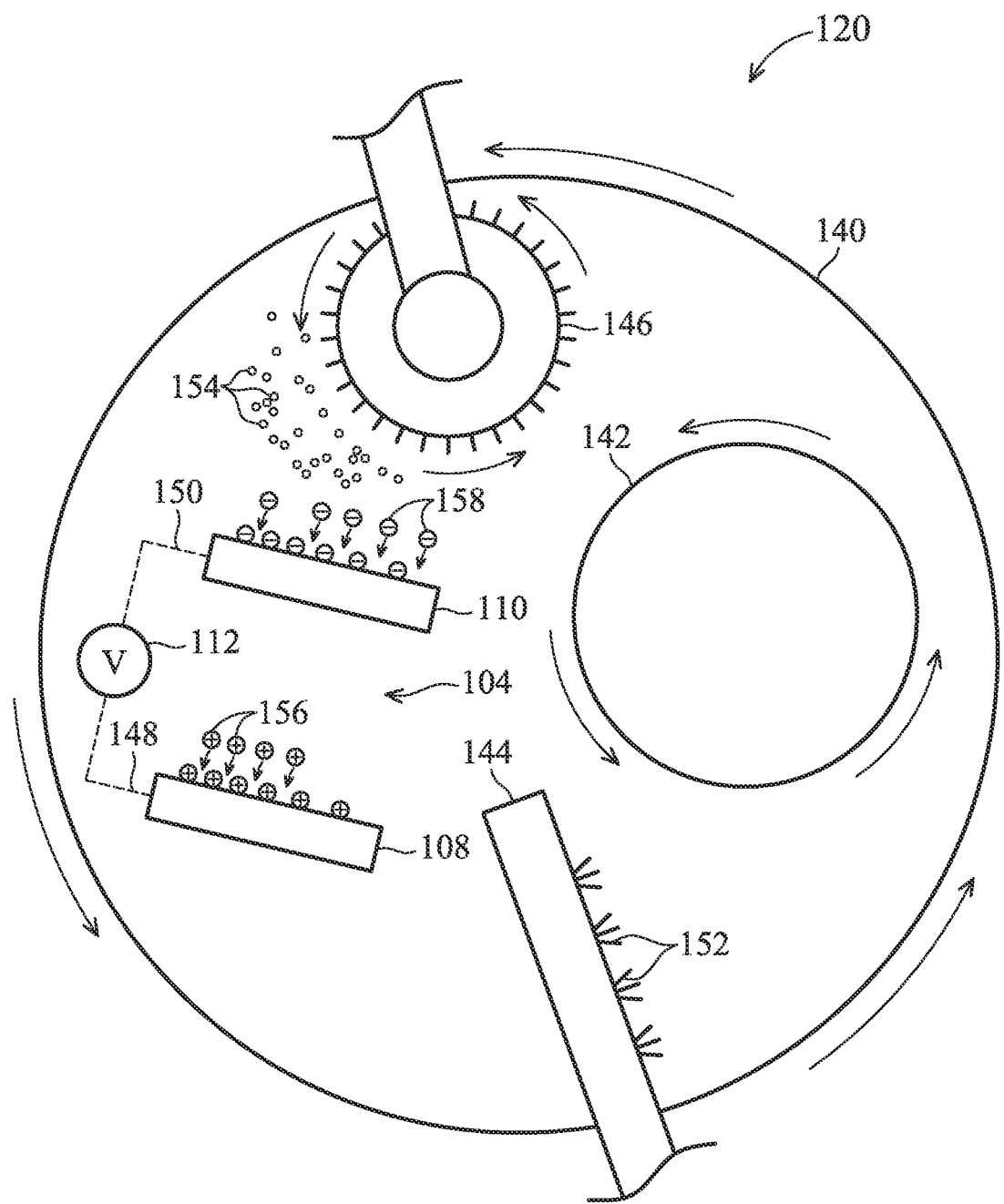

FIG. 2B is a top view of a main polishing station 120, according to one embodiment. The main polishing station 120 is substantially similar to the main polishing station of FIG. 2A, except that the first and second electrodes 108, 110 are arranged in a flow-through mode. In the flow-through mode, the first and second electrodes 108, 110 are arranged substantially perpendicular to the direction of flow of the slurry 152. Though not shown in FIG. 2B, the first electrode 108 and the second electrode 110 include gaps, slots, pores, or other apertures that allow the slurry 152 to flow-through the first and second electrodes 108, 110. Accordingly, as the slurry 152 is carried with the pad 140 to the first electrode 108 and the second electrode 110, the slurry 152 flows through gaps holes, pores, apertures, or slots in the first and second electrodes 108, 110. Negatively charged particles 158 are adsorbed by the second electrode 110 to which a positive voltage is applied. Positively charged particles are adsorbed by the first electrode 108 to which a negative voltage is applied. In this way, as the slurry 152 flows through the first electrode 108 and the second electrode 110, debris and impurities are removed from the slurry 152.

With reference to both FIG. 2A and FIG. 2B, an impurity removal system 104 can be implemented in the chemical buff stations 122 in the same manner as the main polishing stations 120. The chemical buff stations 122 include the same components and operate in substantially the same way as the main polishing stations 120. One difference is that at the chemical buff stations 122 the slurry supply system 144 supplies a slurry 152 including different chemicals than are included in the slurry 152 of the main polishing stations 120. Nevertheless, the positions and operations of the components of the chemical buff stations 122 are substantially the same as the positions and operations of the main polishing stations 120. Accordingly, the impurity removal systems 104 of FIGS. 2A and 2B can be implemented in the chemical buff stations 122. The first and second electrodes 108 and 110 perform a charged particle separation process on the slurry as the slurry is carried by or through the first and second electrodes 108 and 110.

Figure 2C:
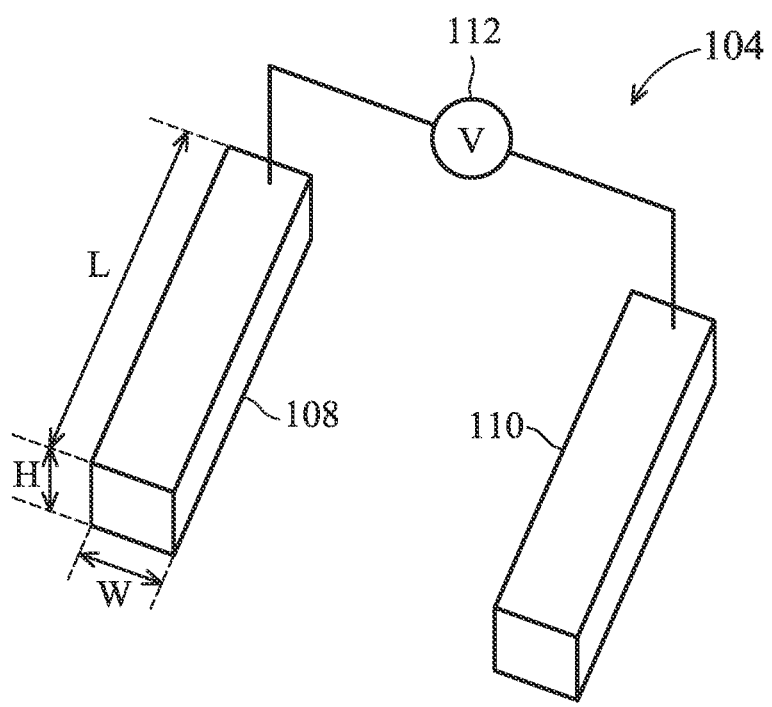
FIGS. 2C and 2D are illustrations of an impurity removal system, according to one embodiment.

FIG. 2C is a perspective view of an impurity removal system 104, according to one embodiment. The first and second electrodes 108 and 110 can be made of a conductive material. The conductive material can include one or more of gold, silver, platinum, palladium, titanium, copper, tin, nickel, iron, cobalt, aluminum, chrome, or manganese. The conductive material can include alloys of one or more of the materials described above. The first and second electrodes 108, 110 can include other materials analysis than those described above without departing from the scope of the present disclosure.

The first and second electrodes 108, 110 have a width W as shown in FIG. 2C. In one example, the width W is between 0.01 cm and 30 cm. The first and second electrodes 108, 110 can have a width outside this range without departing from the scope of the present disclosure.

The first and second electrodes 108, 110 have a length L as shown in FIG. 2C. In one example, the length L is between 0.5 cm and 80 cm. The first and second electrodes 108, 110 can have a length L outside this range without departing from the scope of the present disclosure.

The first and second electrodes 108, 110 have a height H as shown in FIG. 2C. In one example, the height H is between 0.01 cm and 30 cm. The first and second electrodes 108, 110 can have a height H outside this range without departing from the scope of the present disclosure.

The impurity removal system can be operated in a constant voltage mode. In the constant voltage mode the power source 112 applies a constant voltage between the first electrode 108 and the second electrode 110. The constant voltage mode can be utilized when the first and second electrodes 108 and 110 are oriented in either the flow by mode or the flow-through mode. In one example, in the constant voltage mode the power source 112 applies a voltage between 0 V and ±50 V. Other voltages can be applied by the power source 112 without departing from the scope of the present disclosure.

The impurity removal system can be operated in a constant current mode. In the constant current mode the power source 112 drives a constant current between the first electrode 108 and the second electrode 110. The constant current mode can be utilized when the first and second electrodes 108 and 110 are oriented in either the flow by mode or the flow-through mode. In one example, in the constant current mode the power source 112 drives a current thin value between 0 A and ±30 A. Other currents can be given by the power source 112 without departing from the scope of the present disclosure.

Figure 2D:
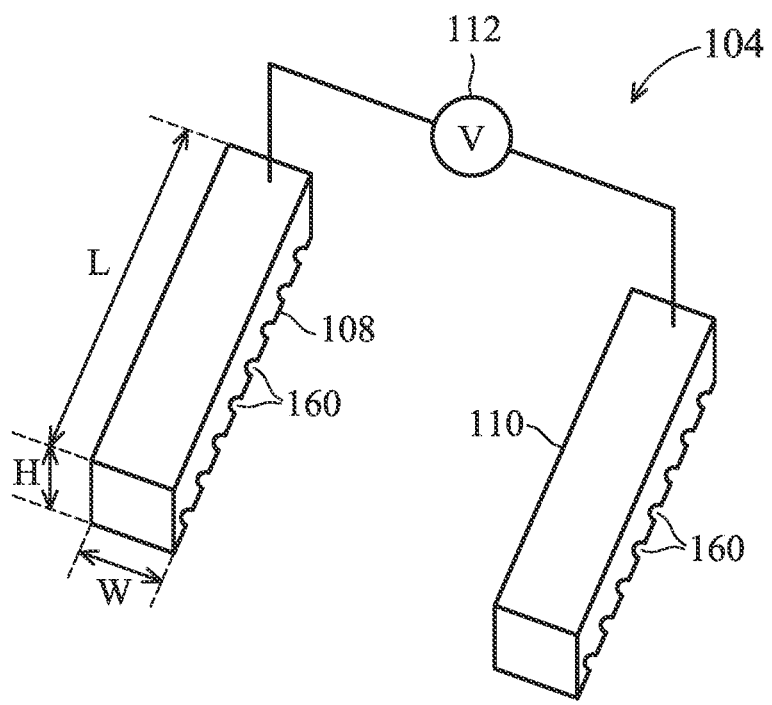

FIG. 2D is a perspective view of an impurity removal system 104, according to one embodiment. The impurity removal system 104 of FIG. 2D is substantially similar to the impurity removal system 104 of FIG. 2C, except that the first and second electrodes 108 and 110 include apertures 160. The apertures 160 allow slurry 152, or other fluids in other embodiments, to flow through the first and second electrodes 108 and 110. This can be particularly suitable to the flow-through mode. However, the first and second electrodes 108 and 110 of FIG. 2D can also be utilized in the flow by mode. The first and second electrodes 108 and 110 can include gaps, pores, slots, or other types of openings than the apertures 160 shown in FIG. 2D without departing from the scope of the present disclosure.

Figure 3:
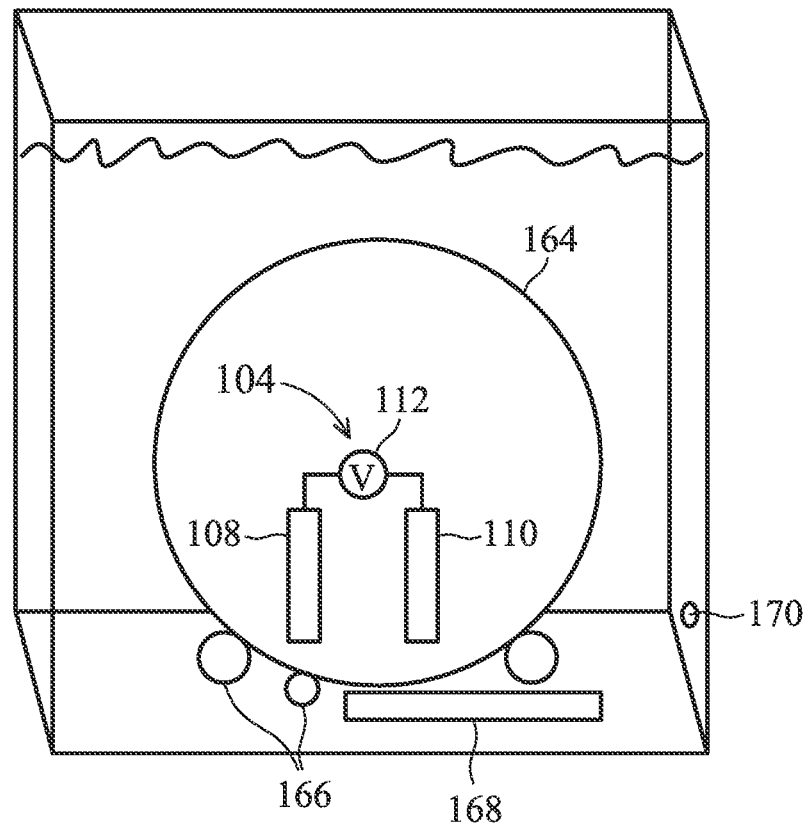
FIG. 3 is an illustration of a washing tank of a chemical mechanical planarization system, according to one embodiment.

FIG. 3 is an illustration of a washing tank 124 of a cleaner 105 of the CMP system 100, according to one embodiment. The washing tank 124 is a first cleaning stage after the CMP processes have been performed by the main polishing stages 120 and the chemical buff stages 122. A robot arm of the transportation system 107 lowers a wafer 164 into the washing tank 124. The washing tank 124 is filled with deionized water. The wafer 124 is submerged in the deionized water.

The washing tank 164 includes rollers 166 that rotate the wafer 164 while the wafer 164 is in the washing tank. The rollers 166 contact the edge of the wafer 164 and rotate the wafer 164 by friction force. In one embodiment, the rollers 166 rotate a wafer at a rate between 5 rpm and 20 rpm, though other rotational speeds can be utilized without departing from the scope of the present disclosure.

In one embodiment, the washing tank 164 includes one or more ultrasonic transducers 168. The ultrasonic transducers 168 receive electrical signals and generate corresponding ultrasonic vibrations in the deionized water of the washing tank 124. The ultrasonic vibrations, can assist in cleaning the wafer 164.

In one embodiment, the washing tank 164 includes an inlet 170. Deionized water supply into the tank via the inlet 170. In practice, the deionized water overflows from the washing tank 124 into an overflow tank that includes a drain.

The washing tank 124 includes an impurity removal system 104. The impurity removal system 104 includes a first electrode 108, a second electrode 110, and a power source 112. The power source 112 applies a voltage or drives a currents between the first electrode 108 and the second electrode 110. The first and second electrodes 108 and 110 perform a charged particle separation process by which impurities and debris that carry a net charges in the deionized water are adsorbed by the first and second electrodes 108 and 110. The impurity removal system 104 operates in substantially the same way as described in relation to FIGS. 1A-2D. After the wafer 164 has been cleaned in the washing tank 124, a robot arm of the wafer transportation unit 107 removes the wafer 164 from the washing tank 124 and carries the wafer 164 to a precleaning station 126.

Figure 4:
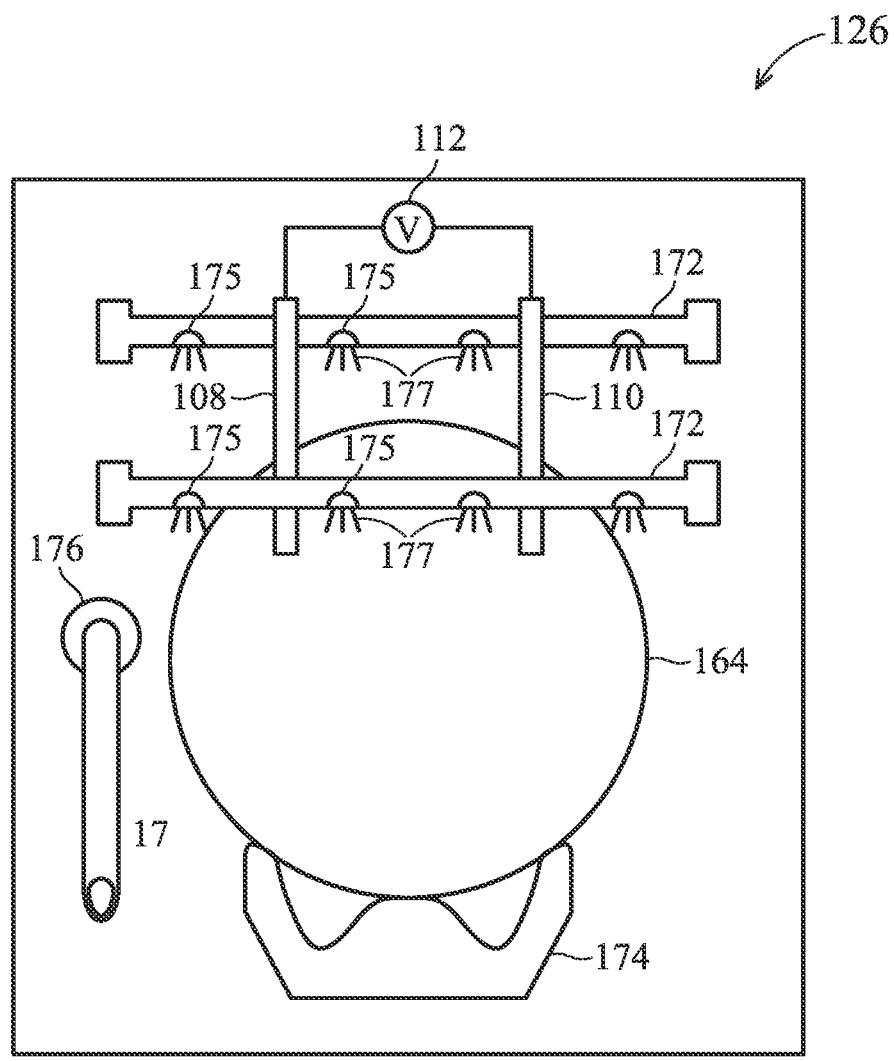
FIG. 4 is an illustration of a precleaning station of a chemical mechanical planarization system, according to one embodiment.

FIG. 4 is an illustration of a precleaning station 126 of the cleaner 105 of the CMP system 100 of FIG. 1B, according to one embodiment. A robot arm of the wafer transportation unit 107 lowers the wafer 164 into the precleaning station 126. The wafer 164 rests on a roller system 174. The roller system 174 rotates the wafer 164. The roller system 174 can rotate the wafer 126 with the rotational speed between 5 rpm and 20 rpm.

The precleaning station 126 includes chemical spray bars 172. The chemical spray bars 172 include nozzles or apertures 175. The nozzles or apertures 175 spray a cleaning chemical 177 onto the wafer 164. The cleaning chemical 177 is selected to preclean the wafer 164. One example, the cleaning chemical 177 includes isopropyl alcohol.

The precleaning station 126 includes a cleaning arm 176. The cleaning arm 176 can include a head with the brush that is rotated to the wafer 164 and gently brushes or scrubs the surface of the wafer 164. The head of the cleaning arm 176 may also rotate such that the brush rotates while cleaning the surface of the wafer 164.

The precleaning station 126 includes an impurity removal system 104. The impurity removal system 104 includes a first electrode 108, a second electrode 110, and a power source 112. The power source 112 applies a voltage or drives a currents between the first electrode 108 and the second electrode 110. The first and second electrodes 108 and 110 perform a charged particle separation process by which impurities and debris that carry a net charges in the cleaning chemical 177, or particles removed from the wafer 164 by action of the cleaning arm 176, are adsorbed by the first and second electrodes 108 and 110. The impurity removal system 104 operates in substantially the same way as described in relation to FIGS. 1A-3. After the wafer 164 has been cleaned in the precleaning station 126, a robot arm of the wafer transportation unit 107 removes the wafer 164 from the precleaning station 126 and carries the wafer 164 to a brush box 130.

Figure 5:
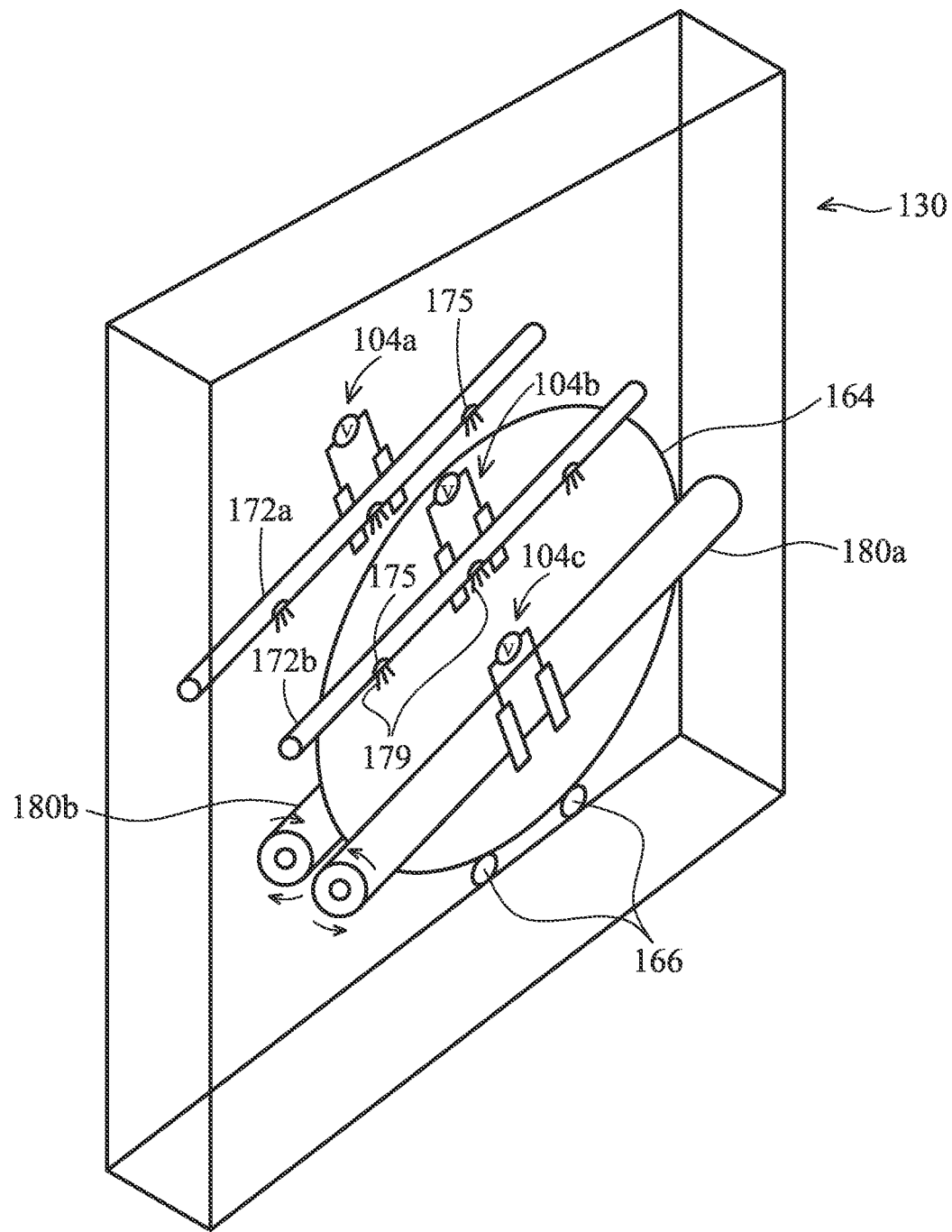
FIG. 5 is an illustration of a brush box of a chemical mechanical planarization system, according to one embodiment.

FIG. 5 is an illustration of a brush box 130 of the cleaner 105 of the CMP station 100 of FIG. 1B, according to one embodiment. A robot arm of the wafer transportation unit 107 lowers the wafer 164 into the brush box 130. The brush box 130 includes roller brushes 180a and 108b. The wafer 164 is positioned between the roller brushes 180a and 180b. The roller brushes 180a and 180b rotate and clean the surfaces of the wafer 164. The brush box 130 also includes rollers 166 that rotate the wafer 164 while the roller brushes 180a and 108b clean the wafer. The roller brushes 180a and 180b are made from a nonabrasive, soft material that will not damage the surface of the wafer 164.

The brush box 130 also includes chemical spray bars 172a and 172b. The chemical spray bars 172a 172b include apertures or nozzles 175 that spray a cleaning chemical 179 onto the surfaces of the wafer 164. The chemical spray bars 172 can be substantially similar to the chemical spray bars 172 of FIG. 4. The cleaning chemical 179 can include ethyl glycol. The cleaning chemical 179 can include other chemicals without departing from the scope of the present disclosure.

The brush box 130 includes a plurality of impurity removal systems 104a-104c. The impurity removal system 104a is positioned adjacent to the first chemical spray bar 172a. The impurity removal system 104a is configured to perform a charged particle separation process that removes charged impurities and debris from the cleaning chemical 179 sprayed onto the wafer 164. The impurity removal system 104b is positioned adjacent to the second chemical spray bar 172b. The impurity removal system 104b is configured to perform a charged particle separation process that removes charged impurities and debris from the cleaning chemical 179 sprayed onto the wafer 164 from the second chemical spray bar 172b.

The impurity removal system 104c is positioned adjacent to the first roller brush 180a. The impurity removal system 104c is configured to remove charged impurities and debris from the roller brush 180a by performing a charged particle removal process. Though not shown in FIG. 5, the brush box 130 can include a fourth impurity removal system 104 positioned adjacent to the second roller brush 180b and configured to remove charged impurities and debris from the second roller brush 180b. The impurity removal systems 104a-104c of FIG. 5 can include the same components and can function substantially similar to the impurity removal systems described in relation to FIGS. 1-4. After the brush box 130 has performed the cleaning process, a robot arm of the wafer transportation unit 107 transports the wafer 164 to the vapor dryer 132.

Figure 6:
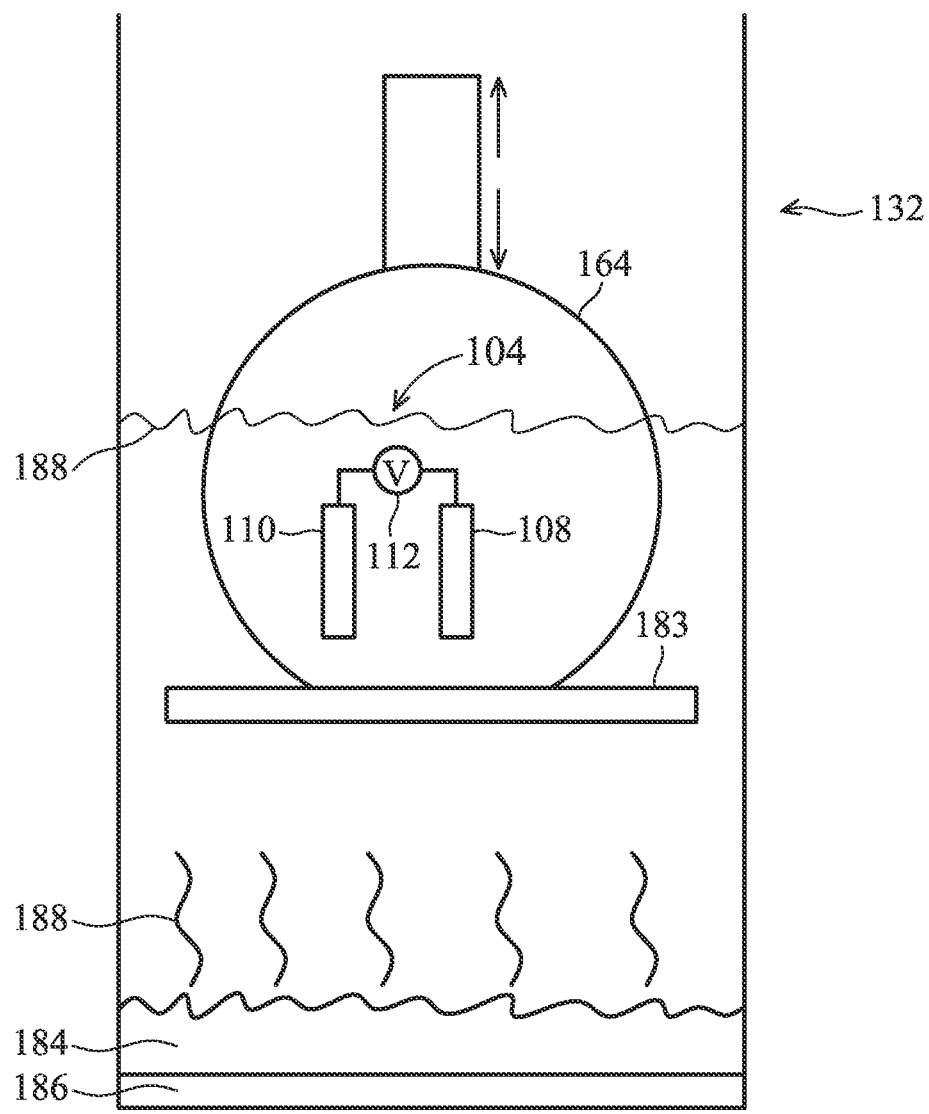
FIG. 6 is an illustration of a vapor dryer of a chemical mechanical planarization system, according to one embodiment.

FIG. 6 is an illustration of the vapor dryer 132 of a cleaner 105 of a CMP system 100 of FIG. 1B, according to one embodiment. The wafer 164 is positioned on a lift 183. The lift 183 raises and lowers the wafer 164 within the vapor dryer 132.

The vapor dryer 132 includes a pool of a liquid chemical 184. The vapor dryer 132 also includes a heater 186. The heater 186 heats the liquid chemical 184. The heating of the liquid chemical 184 generates a vapor 188 from the liquid chemical 184. The vapor 184 rises up the vapor dryer 132. The lift 183 lowers the wafer 164 into the vapor. The vapor 188 has the effect of pushing deionized water and other chemicals off of the surface of the wafer 164. This is accomplished due to the different surface tensions of the vapor and the remaining deionized water or other chemicals. In one example, the liquid chemical 184 is isopropyl alcohol. Accordingly, the vapor 188 is an isopropyl alcohol vapor. The isopropyl alcohol vapor dries the surface of the wafer 164 by pushing remaining deionized water and other chemicals off of the surface of the wafer 164.

The vapor dryer 132 includes an impurity removal system 104. The impurity removal system 104 includes a first electrode 108, a second electrode 110, and a power source 112. The power source 112 applies a voltage or drives a current between the first electrode 108 and the second electrode 110. The first and second electrodes 108 and 110 perform a charged particle separation process by which impurities and debris that carry a net charges in the vapor 188 and other fluids are adsorbed by the first and second electrodes 108 and 110. The impurity removal system 104 operates in substantially the same way as the impurity removal systems 104 described in relation to FIGS. 1A-5. After the wafer 164 has been cleaned in the washing tank 124, a robot arm of the wafer transportation unit 107 removes the wafer 164 from the washing tank 124 and carries the wafer 164 to a precleaning station 126.

Figure 7:
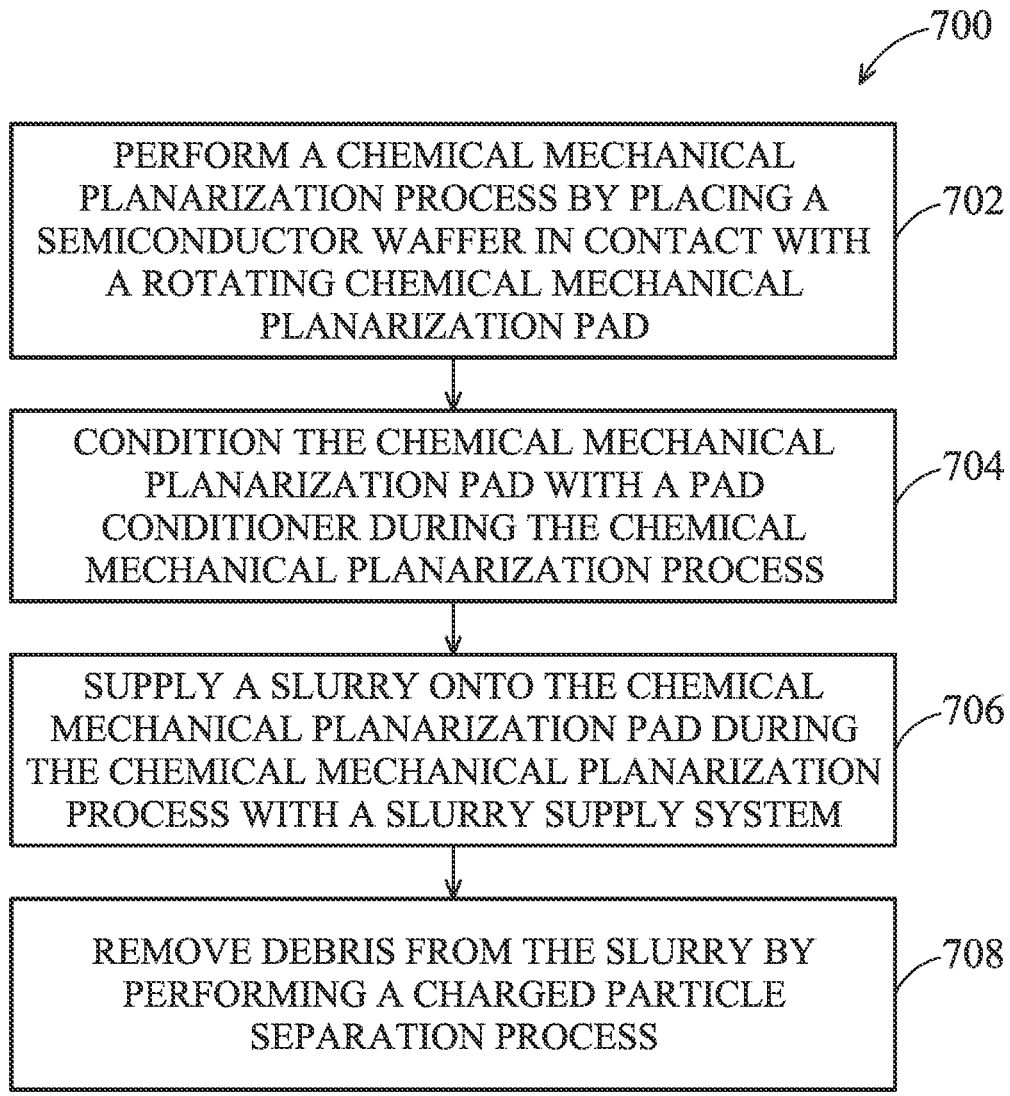
FIG. 7 is a flow diagram of a method for operating a chemical mechanical planarization system, according to one embodiment.

FIG. 7 is a flow diagram of a method 700. At 702, the method 700 includes performing a chemical mechanical planarization process by placing a semiconductor wafer in contact with a rotating chemical mechanical planarization pad. One example of a semiconductor wafer is the wafer 164 of FIG. 3. One example of a rotating chemical mechanical planarization pad. At 704, the method 700 includes conditioning the chemical mechanical planarization pad with a pad conditioner during the chemical mechanical planarization process. One example of a pad conditioner is the pad conditioner 146 of FIG. 2A. At 706, the method 700 includes supplying a slurry onto the chemical mechanical planarization pad during the chemical mechanical planarization process with a slurry supply system. One example of a slurry supply system is the slurry supply system 144 of FIG. 2A. At 708, the method 700 includes removing debris from the slurry by performing a charged particle separation process.

Figure 8:
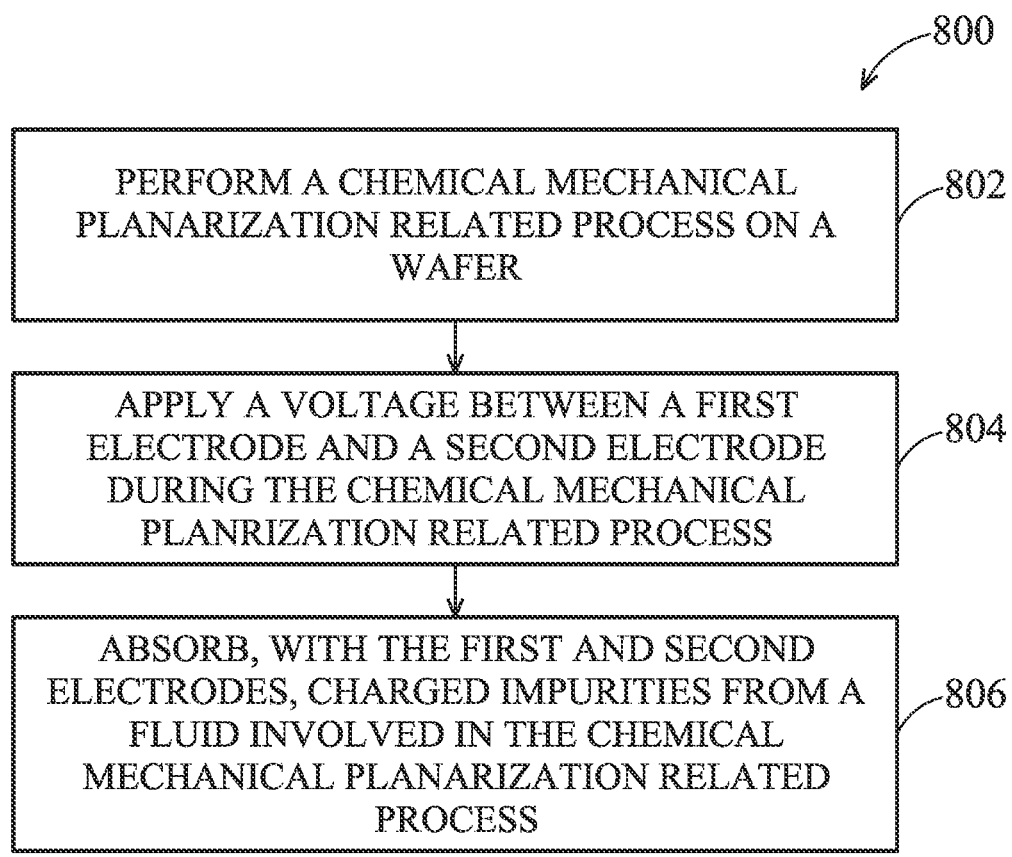
FIG. 8 is a flow diagram of a method for operating a chemical mechanical planarization system, according to one embodiment.

FIG. 8 is a flow diagram of a method 800, according to one embodiment. At 802, the method 800 includes performing a chemical mechanical planarization related process on a wafer. One example of a wafer is the wafer 164 of FIG. 3. At 804, the method 800 includes applying a voltage between a first electrode and a second electrode during the chemical mechanical planarization related process. One example of a first electrode is the first electrode 108 of FIG. 1A. One example of a second electrode is the second electrode 110 of FIG. 1A. At 806, the method 800 includes adsorbing, with the first and second electrodes, charged impurities from a fluid involved in the chemical mechanical planarization related process.

In one embodiment, a method includes performing a chemical mechanical planarization process by placing a semiconductor wafer in contact with a rotating chemical mechanical planarization pad and conditioning the chemical mechanical planarization pad with a pad conditioner during the chemical mechanical planarization process. The method includes supplying a slurry onto the chemical mechanical planarization pad during the chemical mechanical planarization process with a slurry supply system and removing debris from the slurry from the slurry by performing a charged particle separation process.

In one embodiment, a system includes chemical mechanical planarization equipment configured to perform chemical mechanical planarization related processes on a wafer. The system includes an impurity removal system positioned adjacent to the chemical mechanical planarization equipment and configured to remove charged impurities from a fluid adjacent to the wafer. The impurity removal system includes a first electrode, a second electrode, and a power source configured to apply a voltage between the first and second electrode. The system includes a control system configured to control the chemical mechanical planarization equipment and the power source.

In one embodiment, a method includes performing a chemical mechanical planarization related process on a wafer, applying a voltage between a first electrode and a second electrode during the chemical mechanical planarization related process, and adsorbing, with the first and second electrodes, charged impurities from a fluid involved in the chemical mechanical planarization related process.

Embodiments of the present disclosure provide many benefits over traditional chemical mechanical planarization systems. Embodiments of the present disclosure utilize an impurity removal system to prevent damage to semiconductor wafers and chemical mechanical planarization equipment. Accordingly, embodiments of the present disclosure increase semiconductor wafer yields and reduce the need for technicians or experts to repair or replace damaged equipment. Instead, the impurity removal system prevention module prevents dangerous debris from damaging the wafer and the chemical mechanical planarization pad. The result is that time and resources are not wasted replacing equipment and scrapped semiconductor wafers.

The various embodiments described above can be combined to provide further embodiments. Aspects of the embodiments can be modified, if necessary, to employ concepts of the various patents, applications and publications to provide yet further embodiments.

These and other changes can be made to the embodiments in light of the above-detailed description. In general, in the following claims, the terms used should not be construed to limit the claims to the specific embodiments disclosed in the specification and the claims, but should be construed to include all possible embodiments along with the full scope of equivalents to which such claims are entitled. Accordingly, the claims are not limited by the disclosure.

The invention claimed is:

1. A method, comprising:
holding a semiconductor substrate with a chemical mechanical planarization head positioned above a rotating chemical mechanical planarization pad;
performing a chemical mechanical planarization process by placing the semiconductor substrate in contact with the chemical mechanical planarization pad while the chemical mechanical planarization head holds the semiconductor substrate;
conditioning the chemical mechanical planarization pad with a pad conditioner during the chemical mechanical planarization process;
supplying a slurry onto the chemical mechanical planarization pad during the chemical mechanical planarization process with a slurry supply system; and
removing debris from the slurry by performing a charged particle separation process, the charged particle separation process including:
positioning a first electrode and a second electrode in the slurry above the rotating chemical mechanical planarization pad, the first electrode and the second electrode being separate from the chemical mechanical planarization head and the pad conditioner, wherein the first and second electrodes are laterally spaced apart from the chemical mechanical planarization head, wherein the slurry flows between the first and second electrodes during the chemical mechanical planarization process; and
applying a voltage between the first electrode and the second electrode.

2. The method of claim 1, further comprising orienting the first electrode and the second electrode in flow-by orientation.

3. The method of claim 1, further comprising orienting the first electrode and the second electrode in flow-through orientation.

4. The method of claim 1, wherein performing the charged particle separation process includes driving a constant current between the first electrode and the second electrode.

5. The method of claim 1, wherein performing the charged particle separation process includes applying a constant voltage between the first electrode and the second electrode.

6. The method of claim 1, wherein the first electrode, the second electrode, the pad conditioner and the chemical mechanical planarization head are substantially coplanar during the charged particle separation process.

7. The method of claim 1, comprising performing a cleaning process on the substrate with a cleaning fluid and third and fourth electrodes after the chemical mechanical planarization process.

8. The method of claim 7, wherein the cleaning fluid is a cleaning chemical, the cleaning process including spraying the cleaning fluid onto the substrate with a spray bar, wherein the third and fourth electrodes are positioned adjacent to the spray bar.

9. The method of claim 8, wherein the cleaning process includes cleaning the substrate with a roller brush, wherein the first and second electrodes are positioned adjacent to the roller brush.

10. The method of claim 9, comprising drying the substrate with a vapor.

11. The method of claim 1, wherein the first electrode and the second electrode each include a plurality of apertures configured to allow the slurry to flow through the first electrode and the second electrode.

12. A method, comprising:
holding a substrate with a chemical mechanical planarization head positioned above a rotating chemical mechanical planarization pad;
performing a chemical mechanical planarization process on a substrate by placing the substrate in contact with the chemical mechanical planarization pad while the chemical mechanical planarization head holds the semiconductor substrate;
supplying a slurry onto the chemical mechanical planarization pad during the chemical mechanical planarization process with a slurry supply system;
positioning a first electrode and a second electrode in the slurry above the rotating chemical mechanical planarization pad during the chemical mechanical planarization, the first electrode and the second electrode being separate from the chemical mechanical planarization head, wherein the first and second electrodes are laterally spaced apart from the chemical mechanical planarization head, wherein the slurry flows between the first and second electrodes during the chemical mechanical planarization process;
applying a voltage between a first electrode and a second electrode during the chemical mechanical planarization related process; and
adsorbing, with the first and second electrodes, charged impurities from the slurry involved in the chemical mechanical planarization related process.

13. The method of claim 12, comprising performing a substrate cleaning process.

14. A method, comprising:
performing, while holding a substrate with a chemical mechanical planarization head, a chemical mechanical planarization process on the substrate including supplying a slurry onto a chemical mechanical planarization pad;
positioning a first electrode and a second electrode of an impurity removal system adjacent to and above the chemical mechanical planarization pad while supplying the slurry, the first and second electrode being separate from the chemical mechanical planarization head; and
removing charged impurities from the slurry with the impurity removal system by applying a voltage between the first electrode and the second electrode with a power source; and
performing a cleaning process on the substrate with a cleaning fluid and third and fourth electrodes after the chemical mechanical planarization process, wherein the fluid is a cleaning chemical, the cleaning process including spraying the cleaning fluid onto the substrate with a spray bar and cleaning the substrate with a roller brush, wherein the first and second electrodes are positioned adjacent to the roller brush, wherein the third and fourth electrodes are positioned adjacent to the spray bar, wherein the first and second electrodes are positioned adjacent to the roller brush.

15. The method of claim 14, wherein the first and second electrodes are configured to adsorb the charged impurities from the slurry.

16. The method of claim 14, comprising performing a cleaning process on the substrate with a cleaning fluid and third and fourth electrodes after the chemical mechanical planarization process.

17. The method of claim 16, wherein the cleaning process includes submerging the substrate in a cleaning tank filled with the cleaning fluid.

18. The method of claim 17, wherein the cleaning fluid is isopropyl alcohol.

19. The method of claim 14, comprising drying the substrate with a vapor.

20. The method of claim 14, wherein the first electrode and the second electrode are positioned in a flow-through orientation.

21. The method of claim 14, wherein the first electrode and the second electrode are positioned in a flow-by orientation.

* * * * *